United States Patent
Millett

(10) Patent No.: US 9,065,414 B2
(45) Date of Patent: Jun. 23, 2015

(54) AUTOMATIC VOLUME REDUCTION

(75) Inventor: Howard D. Millett, Cornelius, OR (US)

(73) Assignee: Intel Corporation, Santa Clara, CA (US)

(*) Notice: Subject to any disclaimer, the term of this patent is extended or adjusted under 35 U.S.C. 154(b) by 434 days.

(21) Appl. No.: 13/077,211

(22) Filed: Mar. 31, 2011

(65) Prior Publication Data

US 2012/0250889 A1  Oct. 4, 2012

(51) Int. Cl.
  *H03G 3/00*  (2006.01)
  *H04B 1/00*  (2006.01)
  *H04R 9/06*  (2006.01)
  *H03G 3/30*  (2006.01)

(52) U.S. Cl.
  CPC .................. *H03G 3/3026* (2013.01)

(58) Field of Classification Search
  CPC ............... H03G 3/3005; H03G 3/348; H03G 2201/208; H03G 3/3026
  USPC ............................. 381/104, 107, 334, 123, 86
  See application file for complete search history.

(56) References Cited

U.S. PATENT DOCUMENTS

| | | | |
|---|---|---|---|
| 2008/0119242 A1* | 5/2008 | Cho | 455/574 |
| 2010/0191536 A1 | 7/2010 | Sampat et al. | |
| 2010/0322438 A1* | 12/2010 | Siotis | 381/98 |

FOREIGN PATENT DOCUMENTS

| | | |
|---|---|---|
| JP | 5007118 A | 1/1993 |
| KR | 20080103213 A | 11/2008 |
| WO | 2012134586 A1 | 10/2012 |

OTHER PUBLICATIONS

International Search Report and Written Opinion received Jul. 30, 2012, for PCT Application No. PCT/US2011/067899, 8 pages.
International Preliminary report on Patentability received for PCT Patent Application No. PCT/US2011/067899, mailed on Oct. 10, 2013, 5 pages.

* cited by examiner

*Primary Examiner* — Vivian Chin
*Assistant Examiner* — Douglas Suthers
(74) *Attorney, Agent, or Firm* — Jordan IP Law, LLC

(57) ABSTRACT

Systems and methods of controlling output volume in mobile devices may include an apparatus having logic to detect a limited power delivery condition of a battery of a mobile platform. The logic may also transmit a hardware alert to an audio controller of the mobile platform in response to the limited power delivery condition, wherein the hardware alert is to instruct the audio controller to conduct a speaker volume reduction to an audible level. In one example, the logic enables the use of one or more high power speakers such as stereo integrated hands free speakers in the mobile device.

15 Claims, 3 Drawing Sheets

AUTOMATIC VOLUME REDUCTION

BACKGROUND

1. Technical Field

Embodiments generally relate to volume control in mobile platforms. More particularly, embodiments relate to the reduction of mobile platform speaker volume in response to the detection of limited power delivery conditions in mobile platform batteries.

2. Discussion

Mobile platform batteries can be subjected to high load conditions due to the operation of system components such as CPUs (central processing units), modems, and IHF (integrated hands free) speakers. When the battery of a mobile platform is in a low voltage state, high load conditions may cause the battery to drop below its minimum operating voltage. A high battery voltage under high load conditions may also cause the battery to exceed its maximum current capability. Indeed, a continued discharge of the battery under such conditions could lead to a system shutdown and/or poor user experience.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Embodiments may involve a method in which a limited power delivery condition is detected in a battery of a mobile platform. The method can also provide for transmitting a hardware alert to an audio controller of the mobile platform in response to the limited power delivery condition, wherein the hardware alert instructs the audio controller to conduct a speaker volume reduction.

Embodiments may also include an apparatus having logic to detect a limited power delivery condition of a battery of a mobile platform. Additionally, the logic may transmit a hardware alert to an audio controller of the mobile platform in response to the limited power delivery condition, wherein the hardware alert is to instruct the audio controller to conduct a speaker volume reduction.

Other embodiments can include a system having an integrated hands free speaker module, an audio controller coupled to the integrated hands free speaker module, and a battery. The system may also include logic coupled to the battery and the audio controller, wherein the logic is to detect a limited power delivery condition of the battery. The logic can also transmit a hardware alert to the audio controller in response to the limited power delivery condition, wherein the hardware alert is to instruct the audio controller to conduct a speaker volume reduction with respect to the integrated hands free speaker module.

Figure 1:
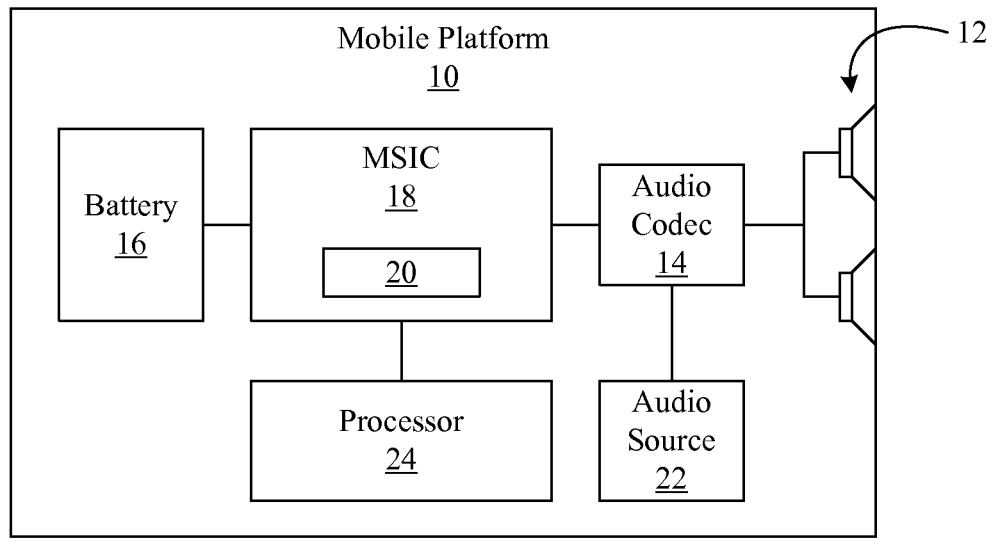
FIG. 1 is a block diagram of an example of a mobile platform according to an embodiment.

Turning now to FIG. 1, a mobile platform 10 is shown. The mobile platform 10 could be part of a laptop, mobile Internet device (MID), smart tablet, personal digital assistant (PDA), wireless smart phone, media player, imaging device, etc., or any combination thereof. In the illustrated example, the mobile platform 10 includes an integrated hands free (IHF) speaker module 12 in which the speakers of the IHF module 12 are incorporated into the enclosure of the mobile platform 10. The mobile platform 10 may also include an audio controller (e.g., codec) 14 coupled to the IHF speaker module 12, and a battery 16. The audio controller 14, which may include a charge pump to boost an input voltage (e.g., 3.8V) to a voltage level appropriate to drive the IHF speaker module 12 (e.g., 5V), can be configured to output audio content (e.g., music, ring tones) from an audio source 22 (e.g., flash memory, device memory, network resource) via the IHF speaker module 12. In particular, the illustrated audio controller 14 sets an output volume of the IHF speaker module 12. Accordingly, the audio controller 14 may also be operatively coupled (e.g., via a serial peripheral interface (SPI) register, not shown) to other user interface (UI) components such as a volume control button (not shown), touch screen volume control (not shown), etc.

An apparatus such as a power management mixed signal integrated circuit (MSIC) 18 may be disposed between the battery 16 and the audio controller 14, wherein the MSIC 18 can include logic 20 to detect a limited power delivery condition of the battery 16, and transmit a hardware alert to the audio controller 14 in response to the limited power delivery condition. As will be discussed in greater detail, the hardware alert can instruct the audio controller 14 to conduct a speaker volume reduction with respect to the IHF speaker module 12. The speaker volume reduction may be from a first audible level to a second audible level (e.g., −3 dB, −6 dB), and could also be scalable/dynamic based on the depletion of the current delivery capacity of the battery 16. Accordingly, the illustrated mobile platform 10 exhibits avoidance of sudden system shutdown with minimal and/or no impact on user listening experience (e.g., no disruption of audio), even in the presence of high load operating components such as modems (not shown), and CPUs such as a processor 24. Indeed, the IHF speaker module 12 may even include high output (e.g., >1 W) mono speakers, or stereo speakers as shown in the illustrated embodiment, without concern over a negative impact on battery life, sudden system shutdown or user listening experience.

The logic 20 of the MSIC 18 may also be configured to transmit a feedback signal such as an interrupt to the processor 24 or other platform component based on the speaker volume reduction. In such a case, the processor 24 can evaluate the platform power state, and conduct an additional speaker volume reduction based on the platform power state (e.g., platform power consumption remains high), conduct a speaker volume increase based on the platform power state (e.g., platform power consumption has decreased), or leave the speaker volume at the level established by the logic 20. Thus, the feedback interrupt signal can enable the processor 24 to determine when it is safe to return the speaker volume to the original level and avoid a "motorboating" condition in which the speaker volume reduction oscillates on and off.

Figure 2:
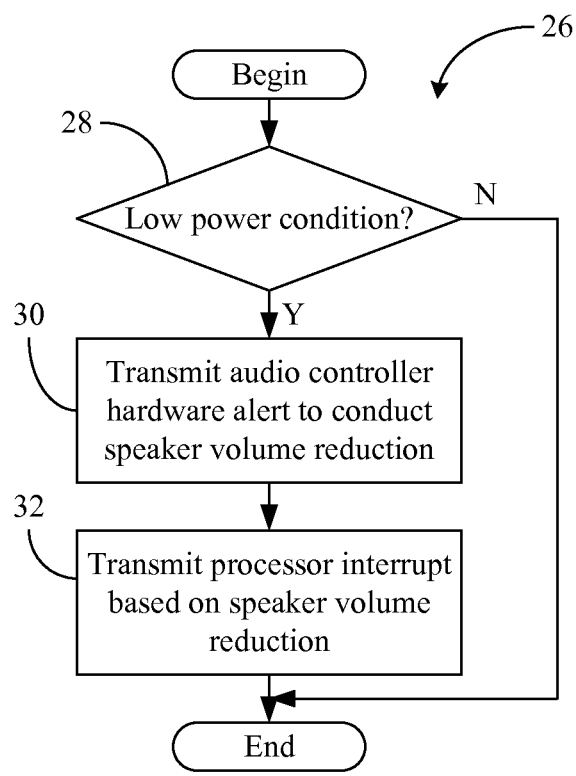
FIG. 2 is a flowchart of an example of a method of managing speaker volume according to an embodiment.

FIG. 2 shows a method 26 of controlling speaker volume in a mobile platform. The method 26 may be implemented in fixed-functionality hardware of a mobile platform using circuit technology such as, for example, application specific integrated circuit (ASIC), complementary metal oxide semiconductor (CMOS) or transistor-transistor logic (TTL) technology. Illustrated processing block 28 provides for detecting a limited power delivery condition of a battery of a mobile platform. Detecting the limited power delivery condition could involve determining that a current draw of the battery is greater than a certain current threshold, determining that a voltage level of the battery is less than a particular voltage threshold, a combination thereof, and so on. If a limited power delivery condition is detected, block 30 may transmit a hardware alert to an audio controller of the mobile platform, wherein the hardware alert instructs the audio controller to conduct a speaker volume reduction to an audible level. In addition, an interrupt can be transmitted to a processor or other component of the mobile platform at block 32 based on the speaker volume reduction. As already noted, the processor might maintain the speaker volume reduction, or take further action such as conducting an additional speaker volume reduction or speaker volume increase.

FIG. 2 may also be repeated so that the speaker volume is reduced gradually to further reduce any negative impact on listening experience. Thus, the volume reduction may be conducted in a smooth manner to prevent the occurrence of "popping" sounds or other sounds.

Figure 3:
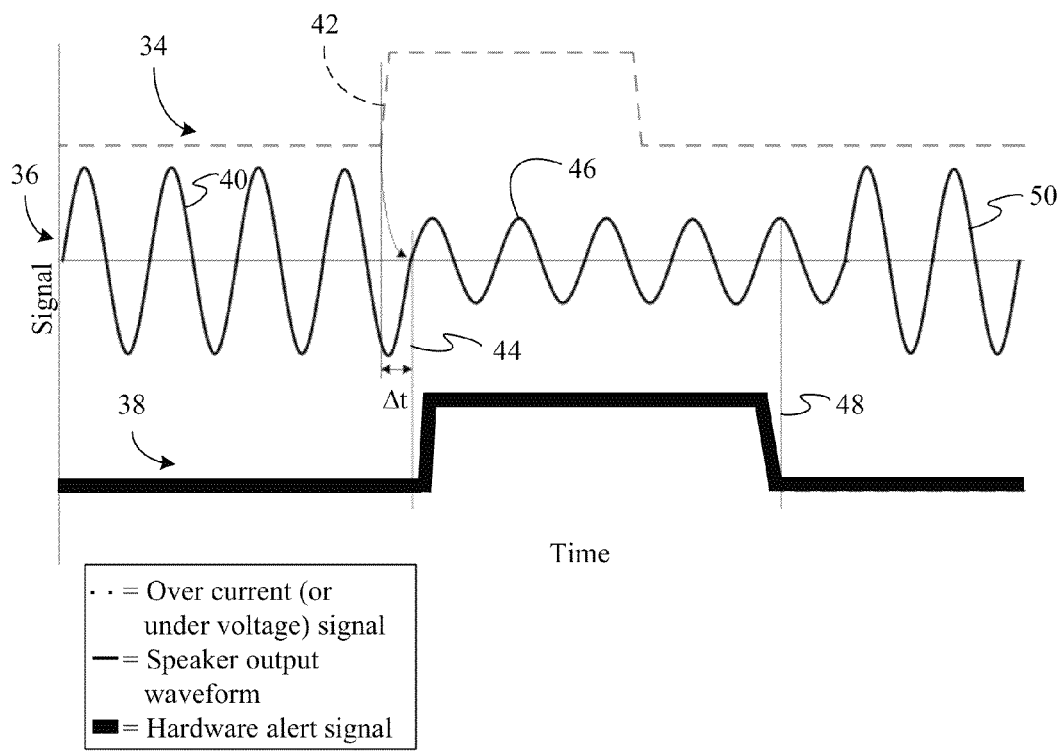
FIG. 3 is a plot of an example of speaker volume management signals according to an embodiment.

Turning now to FIG. 3, a battery over current (or under voltage) signal 34 is shown in conjunction with a speaker output waveform 36 and a hardware alert signal 38. In the example shown, a first portion 40 of the speaker output waveform 36, which could represent the left/right outputs of a stereo IHF speaker module 12 (FIG. 1), demonstrates a relatively high output volume level. At illustrated instant 42, the battery over current signal 34 transitions high to indicate that the current draw on the battery has exceeded a predetermined current threshold (or the battery voltage has fallen below a predetermined voltage threshold). Accordingly, the hardware alert signal 38 may be forced to transition high at instant 44, which can cause a new lower volume level to be loaded into the audio controller 14 (FIG. 1) and a second portion 46 of the speaker output waveform 36 to demonstrate a relatively low output volume level (e.g., stereo speaker volume reduction). Because the alert signal 38 is a hardware alert signal, the time difference ($\Delta t$) between instant 42 and instant 44 may be short enough to respond to high frequency burst conditions. The time difference $\Delta t$ may also be long enough to eliminate any negative impact on user listening experience (e.g., "popping" sounds).

Once the over current condition (or other high load condition) is cleared, the hardware alert signal 38 may be forced low at instant 48, which can in turn cause the previous voltage level to be loaded into the audio controller 14 (FIG. 1) and a third portion 50 of the speaker output waveform 36 to demonstrate the previous output volume level.

Figure 4:
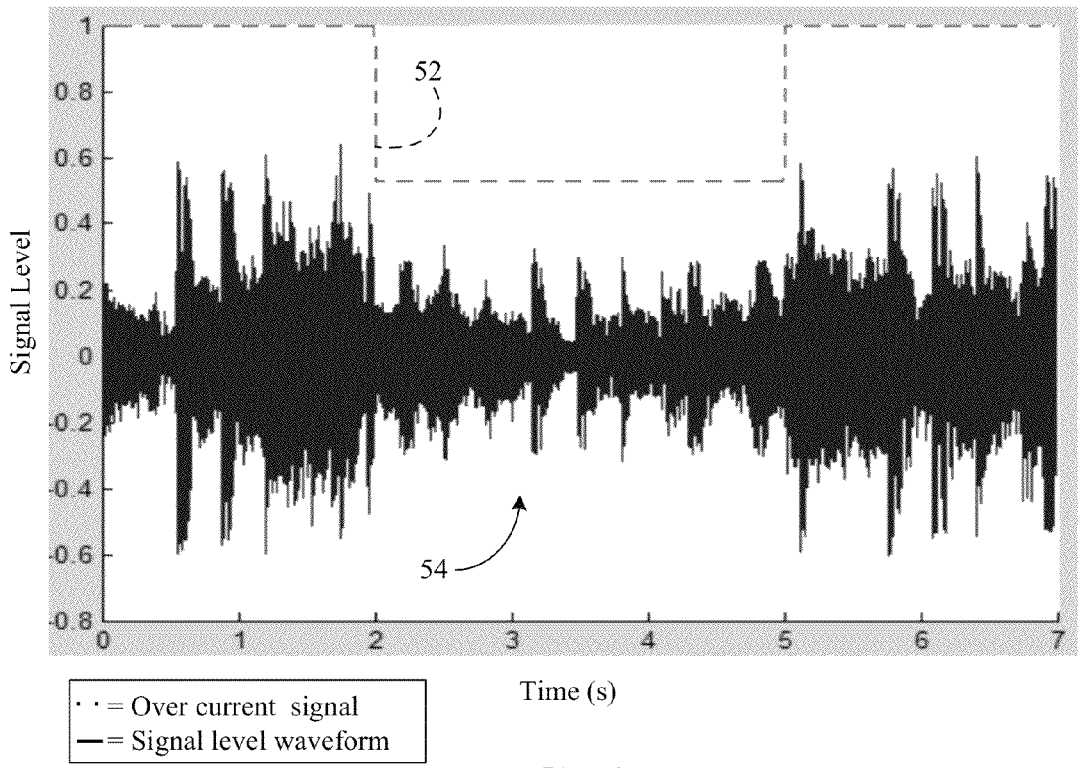
FIG. 4 is a plot of an example of a signal level waveform according to an embodiment.
Figure 5:
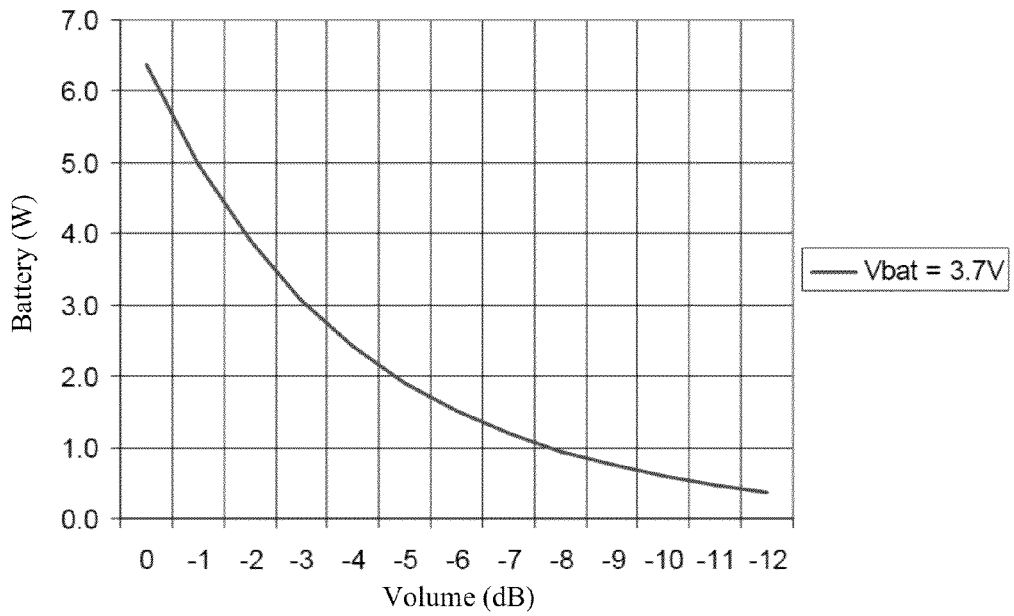
FIG. 5 is a plot of an example of a relationship between battery wattage and speaker volume according to an embodiment.

FIG. 4 shows a battery over current signal 52 in relation to a signal level waveform in which a region 54 of the waveform corresponds to a –6 dB reduction in output volume. In the illustrated example, the –6 dB reduction may be considered only slightly noticeable from a listener perspective. Moreover, such a reduction can significantly increase battery life and/or avert a premature system shutdown due to battery under voltage or over current. For example, FIG. 5 shows a curve 56 that demonstrates the relationship between battery wattage and output volume. In the illustrated example, a –3 dB reduction in volume produces a 3 W decrease in load on the battery, and a –6 dB reduction in volume produces a 4.5 W decrease in load on the battery.

Table I below shows the power and duration results of a high signal amplitude analysis conducted on different types of ringtones played through the loudspeakers of a handheld smart phone.

TABLE I

| Ringtone mp3 | $W_{rms}$ per ch into 8 ohms | $W_{rms}$ at battery | $W_{rms}$ after –6 dB | Peak Duration |
|---|---|---|---|---|
| Irritating Sound Ringtone | 0.9 W | 2.647 W | 0.662 W | 400 ms |
| Ferrari Ringtone | 1.6 W | 4.705 W | 1.176 W | 1.2 s |
| Loud_Ship_Horn_2010 | 0.621 W | 1.826 W | 0.294 W | 2 s |
| Old Telephone Ringtone | 1.55 W | 4.558 W | 1.140 W | 2 s |

Thus, comparing the fourth column ($W_{rms}$ at battery) to the third column ($W_{rms}$ after –6 dB), the automatic volume reduction generally reduced power to approximately 25% of the previous level from the perspective of the battery. Inefficiencies of Class-D amplifiers and boost regulators were taken into consideration.

Figure 6:
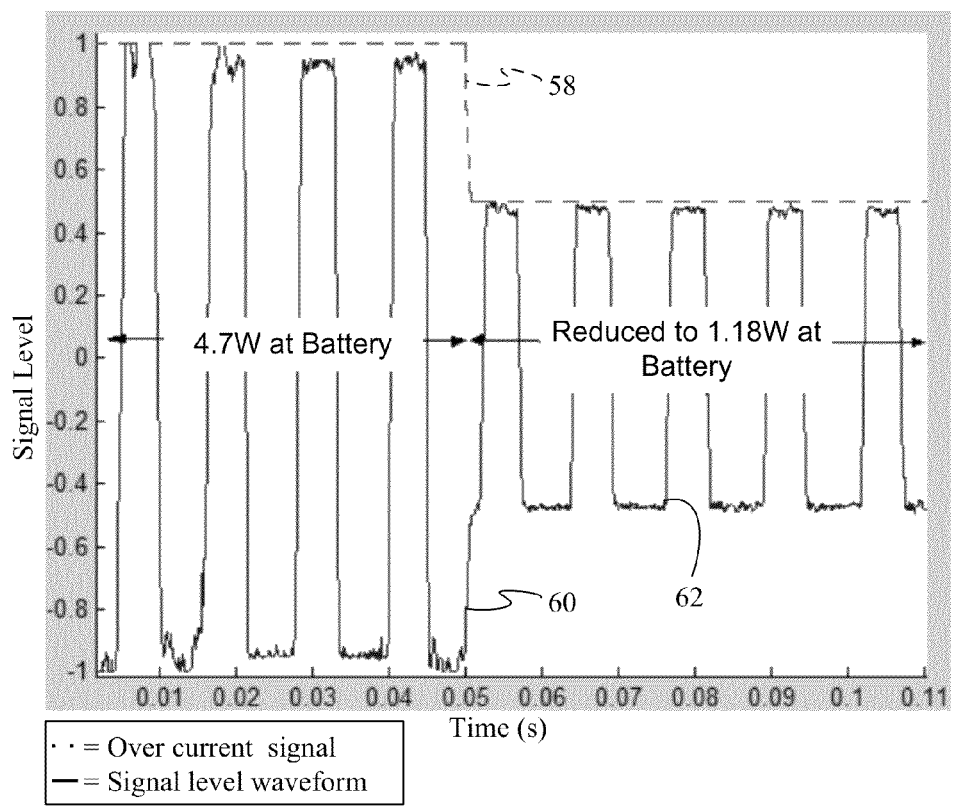
FIG. 6 is a plot of an example of a ringtone signal level waveform according to an embodiment.

Turning now to FIG. 6, a battery over current signal 58 is shown in relation to a signal level waveform for the "Ferrari Ringtone" of Table I. In the illustrated example, a hardware alert reduces a first portion 60 of the waveform by –6 dB and in turn reduces the load on the battery from a 4.7 $W_{rms}$ to 1.18 $W_{rms}$ in a second portion 62 of the waveform.

The techniques described herein therefore enable the use of multiple higher power speakers (e.g., >1 W) such as stereo speakers with mobile platforms such as handheld devices without causing inadvertent system shutdowns, reduced battery life, or negative listening experience.

Embodiments described herein are applicable for use with all types of semiconductor integrated circuit ("IC") chips. Examples of these IC chips include but are not limited to processors, controllers, chipset components, programmable logic arrays (PLAs), memory chips, network chips, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

I claim:

1. A mobile platform comprising:
   an integrated hands free speaker module, wherein the integrated hands free speaker module is integral with the mobile platform;
   an audio controller coupled to the integrated hands free speaker module;
   a battery;
   a processor; and
   logic coupled to the processor, the battery, and the audio controller, the logic to,
      detect a limited power delivery condition of the battery while audio content is being output via the integrated hands free speaker module,
      transmit a hardware alert to the audio controller in response to the limited power delivery condition, wherein the hardware alert is to instruct the audio controller to conduct a speaker volume reduction with respect to the integrated hands free speaker module, and wherein the speaker volume reduction is to cause an audible level of the audio content being output to be reduced to decrease load on the battery from a first load level while the audio content is being output to a second load level while the audio content is being output, and
      transmit an interrupt to the processor based on the speaker volume reduction, wherein the processor is to conduct one or more of an additional speaker volume reduction and a speaker volume increase based on a platform power state in response to the interrupt.

2. The mobile platform of claim 1, wherein the speaker volume reduction is to be from a first audible level of the audio content being output before the hardware alert to a second audible level of the audio content being output after the hardware alert to decrease the load on the battery from the first load level before the hardware alert to the second load level after the hardware alert while the audio content is being output.

3. The mobile platform of claim 1, wherein the integrated hands free speaker module includes stereo speakers and the speaker volume reduction is to be a stereo speaker volume reduction.

4. The mobile platform of claim 1, wherein the logic is to determine that a current draw on the battery has exceeded a predetermined current threshold while the audio content is being output.

5. The mobile platform of claim 1, wherein the logic is to determine that a voltage level of the battery has fallen below a predetermined voltage threshold while the audio content is being output.

6. An apparatus comprising:
   a first logic circuit portion to detect a limited power delivery condition of a battery of a mobile platform while audio content is being output,
   a second logic circuit portion to transmit a hardware alert to an audio controller of the mobile platform in response to the limited power delivery condition, wherein the hardware alert is to instruct the audio controller to conduct a speaker volume reduction, and wherein the speaker volume reduction is to cause an audible level of the audio content being output to be reduced to decrease load on the battery from a first load level while the audio content is being output to a second load level while the audio content is being output, and
   a third logic circuit portion to transmit an interrupt to a processor of the mobile platform based on the speaker volume reduction, wherein the processor is to conduct one or more of an additional speaker volume reduction and a speaker volume increase based on a platform power state in response to the interrupt.

7. The apparatus of claim 6, wherein the speaker volume reduction is to be from a first audible level of the audio content being output before the hardware alert to a second audible level of the audio content being output after the hardware alert to decrease the load on the battery from the first load level before the hardware alert to the second load level after the hardware alert while the audio content is being output.

8. The apparatus of claim 6, wherein the speaker volume reduction is to be a stereo speaker volume reduction.

9. The apparatus of claim 6, wherein the first logic circuit portion is to determine that a current draw on the battery has exceeded a predetermined current threshold while the audio content is being output.

10. The apparatus of claim 6, wherein the first logic circuit portion is to determine that a voltage level of the battery has fallen below a predetermined voltage threshold while the audio content is being output.

11. A method comprising:
   detecting a limited power delivery condition of a battery of a mobile platform while audio content is being output;
   automatically transmitting a hardware alert to an audio controller of the mobile platform in response to the limited power delivery condition, wherein the hardware alert instructs the audio controller to conduct a speaker volume reduction, and wherein the speaker volume reduction causes an audible level of the audio content being output to be reduced to decrease load on the battery from a first load level while the audio content is being output to a second load level while the audio content is being output; and
   transmitting an interrupt to a processor of the mobile platform based on the speaker volume reduction, wherein the processor conducts one or more of an additional speaker volume reduction and a speaker volume increase based on a platform power state in response to the interrupt.

12. The method of claim 11, wherein the speaker volume reduction is from a first audible level of the audio content being output before the hardware alert to a second audible level of the audio content being output after the hardware alert to decrease the load on the battery from the first load level before the hardware alert to the second load level after the hardware alert while the audio content is being output.

13. The method of claim 11, wherein the speaker volume reduction is a stereo speaker volume reduction.

14. The method of claim 11, wherein detecting the limited power delivery condition includes determining that a current draw on the battery has exceeded a predetermined current threshold while the audio content is being output.

15. The method of claim 11, wherein detecting the limited power delivery condition includes determining that a voltage level of the battery has fallen below a predetermined voltage threshold while the audio content is being output.

* * * * *